United States Patent
Higashiyama et al.

(10) Patent No.: US 10,535,810 B2
(45) Date of Patent: Jan. 14, 2020

(54) CONTROL APPARATUS AND FLUID FEEDER CONTROL METHOD

(71) Applicant: JTEKT CORPORATION, Osaka-shi, Osaka (JP)

(72) Inventors: Yoshimichi Higashiyama, Kashihara (JP); Masami Naka, Yamatokoriyama (JP); Tsukasa Sakazaki, Kizugawa (JP)

(73) Assignee: JTEKT CORPORATION, Osaka-shi (JP)

(*) Notice: Subject to any disclaimer, the term of this patent is extended or adjusted under 35 U.S.C. 154(b) by 138 days.

(21) Appl. No.: 15/463,997

(22) Filed: Mar. 20, 2017

(65) Prior Publication Data

US 2017/0288120 A1 Oct. 5, 2017

(30) Foreign Application Priority Data

Mar. 30, 2016 (JP) ................. 2016-068211

(51) Int. Cl.
| | |
|---|---|
| *H01L 41/04* | (2006.01) |
| *F16N 29/04* | (2006.01) |
| *F16N 13/00* | (2006.01) |
| *F16C 33/66* | (2006.01) |
| *F16N 7/36* | (2006.01) |
| *H01L 41/09* | (2006.01) |

(52) U.S. Cl.
CPC .......... *H01L 41/042* (2013.01); *F16C 33/667* (2013.01); *F16C 33/6659* (2013.01); *F16N 7/36* (2013.01); *F16N 13/00* (2013.01); *F16N 29/04* (2013.01); *F16C 2202/36* (2013.01); *F16C 2380/26* (2013.01); *F16N 2013/003* (2013.01); *H01L 41/09* (2013.01)

(58) Field of Classification Search
CPC . B41J 2/295; B41J 2/1652; B41J 23/20; B41J 9/22; B41J 2/04581; B41J 2/14201; B41J 2/1607
See application file for complete search history.

(56) References Cited

U.S. PATENT DOCUMENTS

| | | | | |
|---|---|---|---|---|
| 5,736,994 A * | 4/1998 | Takahashi | ............ | B41J 2/04541 347/11 |
| 6,109,716 A * | 8/2000 | Takahashi | ............ | B41J 2/04541 347/11 |
| 6,685,300 B1 * | 2/2004 | Ishiyama | ............... | B41J 2/1652 347/23 |

(Continued)

FOREIGN PATENT DOCUMENTS

JP 2007-533902 A 11/2007

*Primary Examiner* — Bickey Dhakal
(74) *Attorney, Agent, or Firm* — Oliff PLC

(57) ABSTRACT

A control apparatus controls driving of an oil feeding unit. The oil feeding unit includes a piezoelectric body that deforms in response to a voltage applied thereto, and a reservoir to store lubricating oil. The capacity of the reservoir changes in accordance with deformation of the piezoelectric body so as to discharge lubricating oil from the oil feeding unit. The control apparatus includes N driving circuits $71a$ to $71n$ configured to apply voltages to the piezoelectric body (where N is an integer equal to or greater than two). The N driving circuits $71a$ to $71n$ are connected in parallel to the piezoelectric body. During oil feeding, the control apparatus uses a predetermined number of the driving circuits selected from the N driving circuits. The predetermined number is smaller than N.

15 Claims, 10 Drawing Sheets

(56) References Cited

U.S. PATENT DOCUMENTS

| | | | | |
|---|---|---|---|---|
| 7,438,376 | B2 * | 10/2008 | Tamura | B41J 2/04541 |
| | | | | 347/17 |
| 7,573,179 | B2 * | 8/2009 | Okuda | B41J 2/04563 |
| | | | | 310/315 |
| 8,308,254 | B2 * | 11/2012 | Tabata | B41J 2/04541 |
| | | | | 347/10 |
| 8,839,534 | B2 * | 9/2014 | Zeno | E02F 3/40 |
| | | | | 37/446 |
| 8,939,534 | B2 * | 1/2015 | Miyazaki | B41J 2/04553 |
| | | | | 347/14 |
| 2005/0219288 | A1 | 10/2005 | Vogeley et al. | |
| 2009/0152050 | A1 * | 6/2009 | Hattori | F16C 33/6674 |
| | | | | 184/6.4 |
| 2013/0265352 | A1 * | 10/2013 | Burress | B41J 2/04581 |
| | | | | 347/9 |

* cited by examiner

CONTROL APPARATUS AND FLUID FEEDER CONTROL METHOD

INCORPORATION BY REFERENCE

The disclosure of Japanese Patent Application No. 2016-068211 filed on Mar. 30, 2016, including the specification, drawings and abstract, is incorporated herein by reference in its entirety.

BACKGROUND OF THE INVENTION

1. Field of the Invention

The invention relates generally to control apparatuses and fluid feeder control methods. More particularly, the invention relates to an apparatus for controlling driving of a fluid feeder including a piezoelectric element and to a method for controlling the fluid feeder.

2. Description of the Related Art

A pump including a piezoelectric element functioning as an actuator is known in the related art. Such a pump is also referred to as a "diaphragm pump". This pump is used in an oil feeder to feed lubricating oil to a rolling bearing, for example.

Japanese Unexamined Patent Application Publication (Translation of PCT Application) No. 2007-533902, for example, discloses a technique involving generating, by a pump driving circuit, a driving signal responsive to the state of a target device to be fed fluid.

A failure in such a pump driving circuit unfortunately stops the feed of fluid, such as lubricating oil. Suppose that an oil feeding unit including a pump to be driven by such a driving circuit is used to feed lubricating oil to a rolling bearing. In such a case, a failure in the pump driving circuit may stop the feed of lubricating oil, resulting in bearing seizure.

SUMMARY OF THE INVENTION

An object of the invention is to provide an apparatus that enables a fluid feeder including a piezoelectric element to feed fluid stably.

A control apparatus according to an aspect of the invention is configured to control driving of a fluid feeder. The fluid feeder includes a piezoelectric element that deforms in response to voltage application thereto, and a reservoir to store fluid to be fed. The fluid feeder is configured to cause a change in capacity of the reservoir in accordance with first deformation of the piezoelectric element so as to discharge the fluid from the reservoir. The apparatus includes driving circuits, and a control circuit. The driving circuits are configured to apply voltages to the piezoelectric element. The control circuit is configured to control the application of voltages to the piezoelectric element from the driving circuits. The number of driving circuits is N, where N is an integer equal to or greater than two. The N driving circuits are connected in parallel to the piezoelectric element. When the fluid feeder feeds the fluid, the control circuit uses a predetermined number of the driving circuits selected from the N driving circuits. The predetermined number is smaller than N.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

A preferred embodiment of the invention will be described below with reference to the drawings. In the following description, the same components and elements are identified by the same reference signs. The components and elements having the same names perform the same functions. Description of the same components and elements will be omitted as unnecessary.

Figure 1:
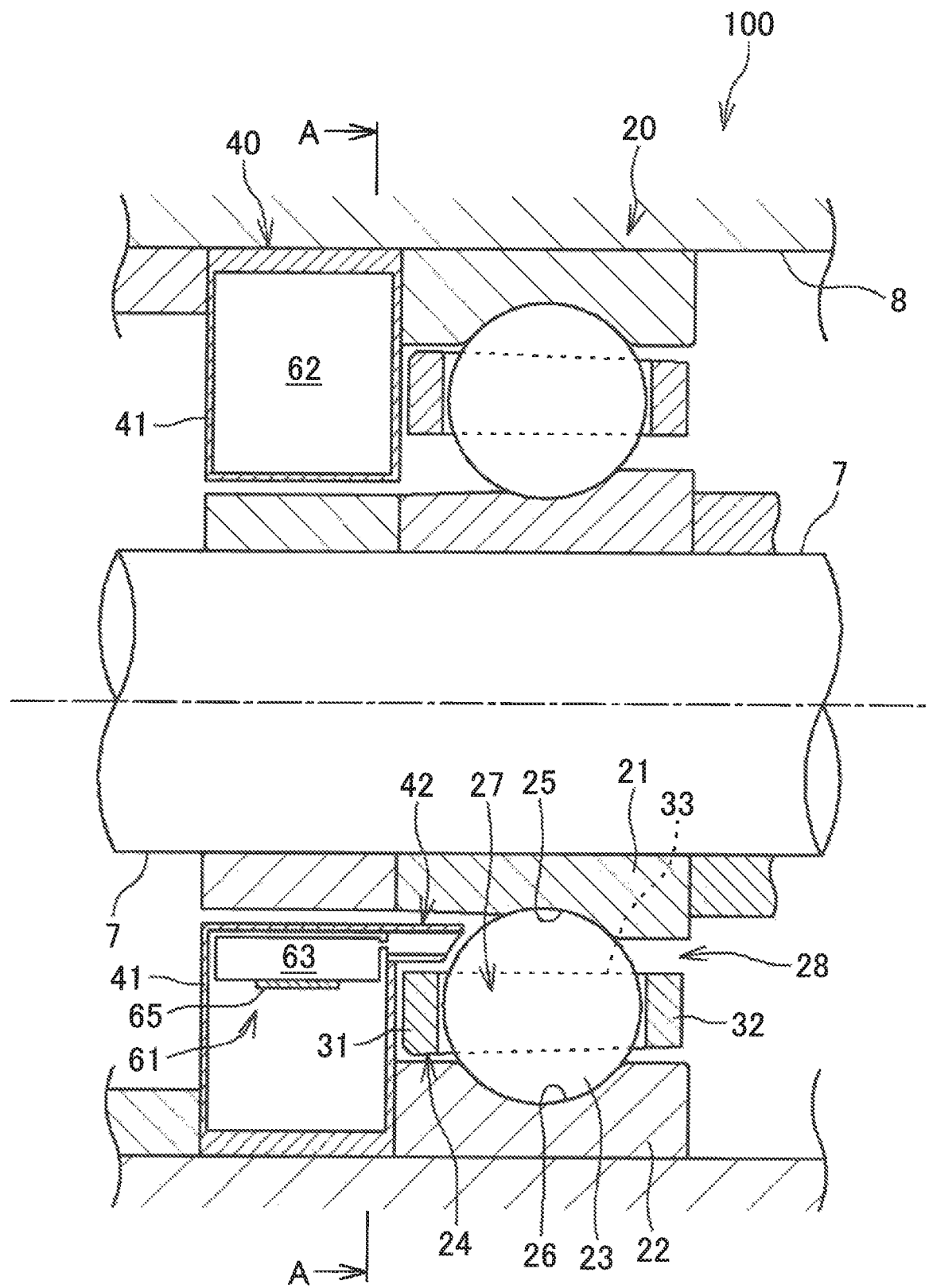
FIG. 1 is a cross-sectional view of a bearing device according to an embodiment of the invention taken along a plane including the central line of a shaft.
Figure 2:
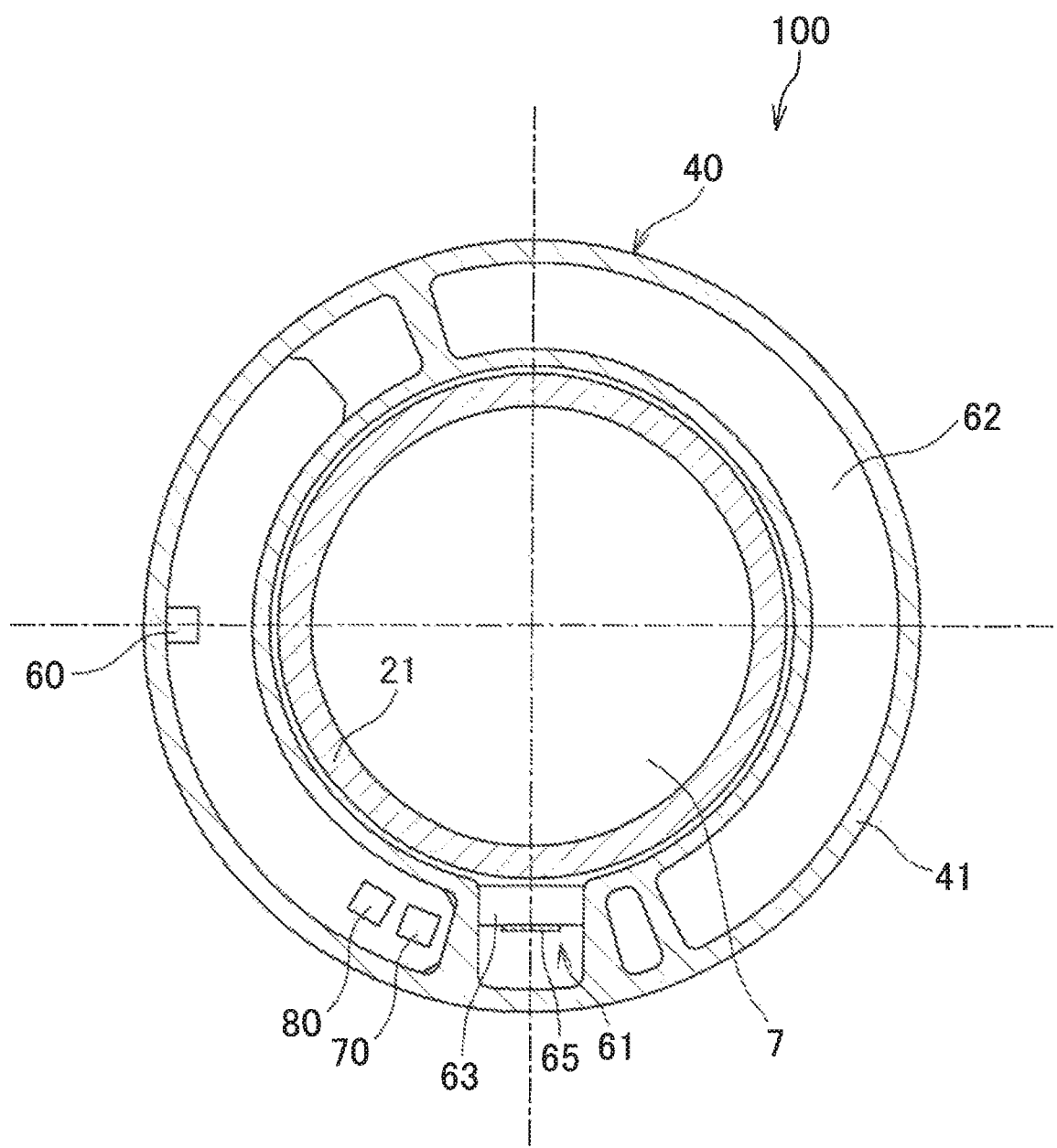
FIG. 2 is a cross-sectional view of the bearing device taken along the line indicated by the arrows A in FIG. 1.

FIG. 1 is a cross-sectional view of a bearing device 100 according to an embodiment of the invention taken along a plane including the central line of a shaft 7. FIG. 2 is a cross-sectional view of the bearing device 100 taken along the line indicated by the arrows A in FIG. 1 and viewed in the axial direction of the shaft 7 (or more specifically, in the direction of the arrows A). Referring to FIGS. 1 and 2, the bearing device 100 includes a bearing body 20, an oil feeding unit 40, a sensor 60, a driver 70, and a controller 80. The bearing device 100 according to this embodiment is housed in a bearing housing 8 so as to support the spindle (i.e., the shaft 7) of a machine tool such that the spindle is rotatable.

The bearing body 20 includes an inner ring 21, an outer ring 22, a plurality of rolling elements 23, and an annular cage 24. The cage 24 holds the rolling elements 23. The inner ring 21 is a cylindrical member fitted onto the shaft 7. The outer periphery of the inner ring 21 is provided with a raceway groove (hereinafter referred to as an "inner ring raceway groove 25"). The outer ring 22 is a cylindrical member secured to the inner peripheral surface of the bearing housing 8. The inner periphery of the outer ring 22 is provided with a raceway groove (hereinafter referred to as an "outer ring raceway groove 26"). The inner ring 21 and the outer ring 22 are disposed concentrically. The concentrically disposed inner ring 21 and outer ring 22 define an annular space 28 therebetween. In this embodiment, the inner ring 21 rotates together with the shaft 7 relative to the outer ring 22.

The rolling elements 23 are disposed in the annular space 28 between the inner ring 21 and the outer ring 22. The rolling elements 23 roll along the inner ring raceway groove 25 and the outer ring raceway groove 26.

The cage 24 is provided in the annular space 28. The cage 24 is an annular member. The cage 24 is provided with a plurality of pockets 27 each configured to hold an associated one of the rolling elements 23. The pockets 27 are located at regular intervals in the circumferential direction of the cage 24. The cage 24 includes a pair of annular portions 31 and 32, and a plurality of cage bars 33. The annular portions 31 and 32 are provided on axial opposite sides of the rolling elements 23. The cage bars 33 couple the annular portions 31 and 32 to each other. The cage bars 33 are circumferentially spaced from each other. Each pocket 27 is a region surrounded by the annular portions 31 and 32 and two circumferentially adjacent ones of the cage bars 33. Each pocket 27 houses an associated one of the rolling elements 23. Thus, the cage 24 holds the rolling elements 23 arranged circumferentially.

The oil feeding unit 40 is provided adjacent to axial one end of the annular space 28 in the bearing body 20. The oil feeding unit 40 is an example of a "fluid feeder". The oil feeding unit 40 is configured to feed lubricating oil to the annular space 28. Lubricating oil is an example of "fluid". The oil feeding unit 40 includes a case 41 and an extension 42. The extension 42 extends axially from the case 41.

A space is defined inside the case 41 included in the oil feeding unit 40. A tank 62 and a pump 61 are provided in the space inside the case 41. The tank 62 is configured to store oil (such as lubricating oil). The pump 61 includes: a reservoir 63 to store lubricating oil; a diaphragm 64 (see FIG. 3); and a piezoelectric body 65. The piezoelectric body 65 is disposed in contact with the diaphragm 64. The piezoelectric body 65 is driven (or deformed) in response to voltage application thereto. The capacity of the reservoir 63 of the pump 61 changes in accordance with deformation of the diaphragm 64 induced by driving the piezoelectric body 65.

First deformation of the diaphragm 64 occurs in response to first driving of the piezoelectric body 65. The capacity of the reservoir 63 decreases in accordance with the first deformation of the diaphragm 64. Thus, a minute amount of lubricating oil stored in the reservoir 63 is discharged to the annular space 28 through the extension 42. The amount of lubricating oil discharged (or fed) from the reservoir 63 to the annular space 28 in this case corresponds to, for example, an ultra-micro flow rate lower than a flow rate on the order of picolitres. An increase in the capacity of the reservoir 63 resulting from deformation of the piezoelectric body 65 causes the pump 61 to suck lubricating oil from the tank 62 so as to replenish the reservoir 63 with lubricating oil.

Referring to FIG. 2, the driver 70 and the controller 80 are provided in the space inside the case 41. As illustrated in FIG. 2, the sensor 60 may be provided in the space inside the case 41. The sensor 60 is configured to measure the index value(s) of viscosity of lubricating oil. The viscosity of lubricating oil changes under the influence of, for example, the temperature of lubricating oil itself, the temperature of ambient air, moisture, and atmospheric pressure. Accordingly, any of these values and/or any combination of these values may be used as the index value(s) of viscosity of lubricating oil. The sensor 60 is, for example, a thermometer to detect the temperature of lubricating oil.

The driver 70 applies a voltage to the piezoelectric body 65. The controller 80 is connected to the driver 70 so as to control application of a voltage to the piezoelectric body 65 from the driver 70. Specifically, the controller 80 includes a control circuit to output a signal that specifies a voltage to be applied to the piezoelectric body 65 and/or the duration of voltage application to the piezoelectric body 65. Thus, the pump 61 carries out an oil feeding operation in accordance with control exercised by the controller 80.

Figure 3:
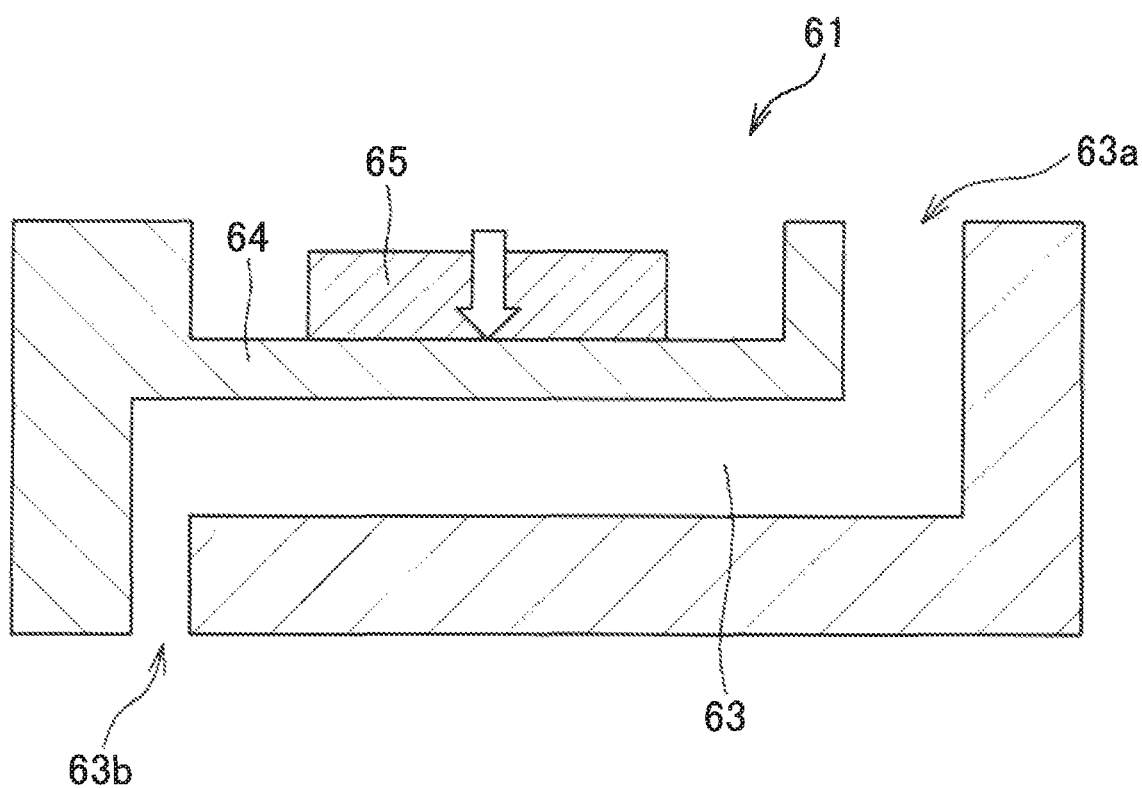
FIG. 3 is a schematic diagram illustrating the structure of a pump included in the bearing device.

FIG. 3 is a schematic diagram illustrating the structure of the pump 61. The pump 61 is a diaphragm pump. Referring to FIG. 3, the pump 61 includes an opening 63*a*, an opening 63*b*, and the diaphragm 64. The opening 63*a* extends from the reservoir 63 to or toward the tank 62. The opening 63*b* extends from the reservoir 63 to or toward the extension 42. The diaphragm 64 defines at least a portion of the reservoir 63. Lubricating oil flows from the tank 62 to the reservoir 63 through the opening 63*a*. Lubricating oil flows from the reservoir 63 to the extension 42 through the opening 63*b*. The piezoelectric body 65 is provided adjacent to the diaphragm 64. Driving the piezoelectric body 65 causes deformation of the diaphragm 64.

Discharging (or feeding) lubricating oil from the reservoir 63 to the annular space 28 involves applying a first voltage to the piezoelectric body 65 from the driver 70. The first voltage is a negative voltage, for example. Application of the first voltage to the piezoelectric body 65 (i.e., a reduction in the voltage applied to the piezoelectric body 65) induces the first driving of the piezoelectric body 65. The first driving is deformation of the piezoelectric body 65 in the direction of the arrow in FIG. 3, for example. This deformation causes the diaphragm 64 to curve such that the diaphragm 64 projects downward, resulting in the first deformation of the diaphragm 64. The first deformation of the diaphragm 64 reduces the capacity of the reservoir 63. As a result, lubricating oil stored in the reservoir 63 is discharged to the annular space 28 through the opening 63*b*. Discharging lubricating oil from the reservoir 63 to the annular space 28 will also be referred to as a "discharging process" in the following description.

Replenishing the reservoir 63 with lubricating oil from the tank 62 involves applying a second voltage to the piezoelectric body 65 from the driver 70. The second voltage is opposite to the first voltage. The second voltage is a positive voltage, for example. Application of the second voltage to the piezoelectric body 65 induces second driving of the piezoelectric body 65. The second driving is opposite to the first driving. The second driving is deformation of the piezoelectric body 65 in a direction opposite to the direction of the arrow in FIG. 3, for example. This deformation causes the diaphragm 64 to curve such that the diaphragm 64 projects upward, resulting in second deformation of the diaphragm 64. The second deformation of the diaphragm 64 increases the capacity of the reservoir 63. As a result, lubricating oil in the tank 62 is sucked into the reservoir 63 through the opening 63*a*. Replenishing the reservoir 63 with lubricating oil will also be referred to as a "replenishing process" in the following description. Feeding lubricating oil to the bearing body 20 from the oil feeding unit 40 (i.e., the oil feeding operation) involves repeating the replenishing process and the discharging process.

Figure 4:
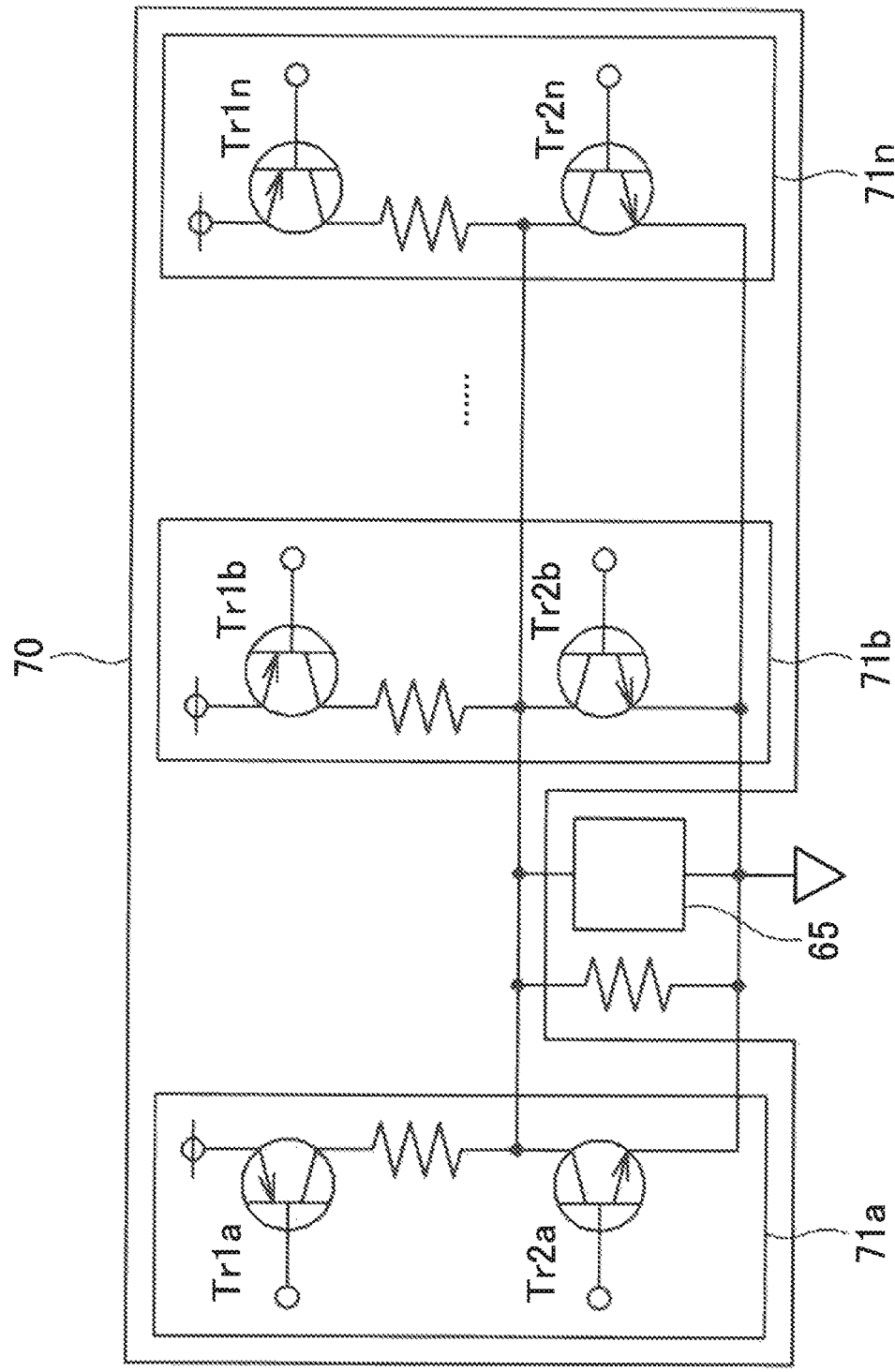
FIG. 4 is a schematic diagram illustrating an example of the circuit configuration of a pump driver.

FIG. 4 is a schematic diagram illustrating an example of the circuit configuration of the driver 70. Referring to FIG. 4, the driver 70 includes a plurality of (e.g., N) driving circuits, i.e., driving circuits 71a to 71n. The driving circuits 71a to 71n will be collectively referred to as "driving circuits 71". The driving circuits 71 include first circuits Tr1a to Tr1n, and second circuits Tr2a to Tr2n. The first circuits Tr1a to Tr2n are each connected in series with an associated one of the second circuits Tr2a to Tr2n, with a resistor (each having a resistance R) interposed therebetween. The first circuits Tr1a to Tr1n will also be collectively referred to as "first circuits Tr1". The second circuits Tr2a to Tr2n will also be collectively referred to as "second circuits Tr2". The first circuits Tr1 and the second circuits Tr2 are switching circuits configured to be turned on and off under control exercised by the controller 80.

The driving circuits 71 are connected in parallel to the piezoelectric body 65. The N driving circuits 71 connected in parallel to the piezoelectric body 65 each apply a voltage V to the piezoelectric body 65, so that a current I supplied to the piezoelectric body 65 is represented by the following equation: $I=V/(R/N)$. Thus, the current I supplied to the piezoelectric body 65 and how the current I will change are controlled in accordance with the number of driving circuits 71 that apply voltages to the piezoelectric body 65.

The first circuits Tr1 cause a current to flow through the piezoelectric body 65. In other words, the first circuits Tr1 apply positive voltages to the piezoelectric body 65. The second circuits Tr2 cause a current to be drawn from the piezoelectric body 65. In other words, the second circuits Tr2 apply negative voltages to the piezoelectric body 65. The switching circuits (i.e., the first circuits Tr1 and the second circuits Tr2) are, for example, bipolar transistors or field-effect transistors (FETs). In one example, the first circuits Tr1 are PNP transistors, and the second circuits Tr2 are NPN transistors.

Turning on the first circuits Tr1 and turning off the second circuits Tr2 applies positive voltages to the piezoelectric body 65. Turning off the first circuits Tr1 and turning on the second circuits Tr2 applies negative voltages to the piezoelectric body 65.

Figure 5:
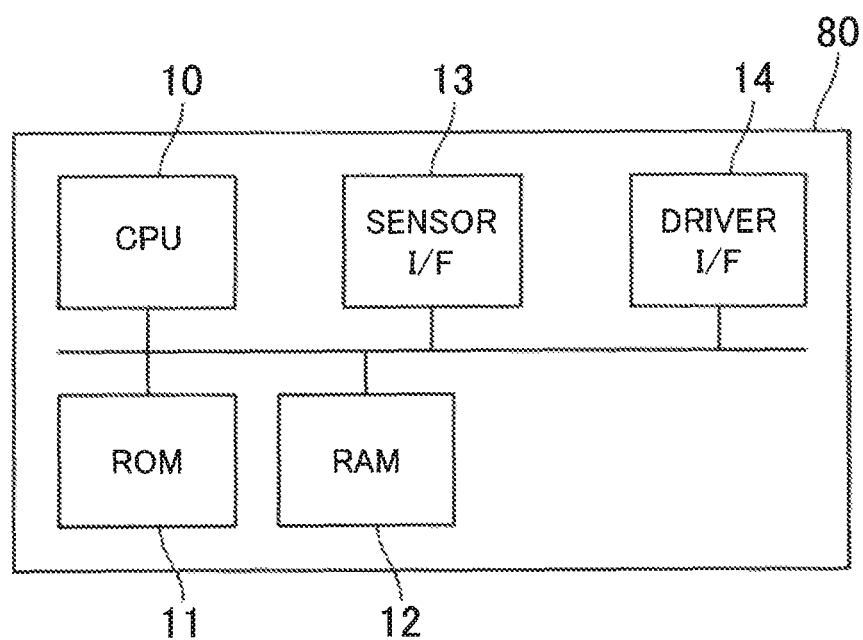
FIG. 5 is a block diagram illustrating an example of the configuration of a controller included in the bearing device.

FIG. 5 is a block diagram illustrating an example of the configuration of the controller 80. The controller 80 is, for example, a single large-scale integration (LSI) circuit. Referring to FIG. 5, the controller 80 includes a central processing unit (CPU) 10, a read-only memory (ROM) 11, a random-access memory (RAM) 12, a sensor interface (I/F) 13, and a driver interface (I/F) 14. The CPU 10 exercises overall control of the controller 80. The ROM 11 stores a program to be executed by the CPU 10. The RAM 12 serves as a working area and stores various data when the CPU 10 executes the program. The sensor I/F 13 is an interface (I/F) for communication with the sensor 60. The driver I/F 14 is an interface (I/F) for communication with the driver 70.

The controller 80 communicates with the driver 70 so as to control feed of oil to the bearing body 20 from the oil feeding unit 40. Accordingly, the driver 70 and the controller 80 function as a control apparatus to control driving of the oil feeding unit 40 that is an example of the fluid feeder.

Figure 6:
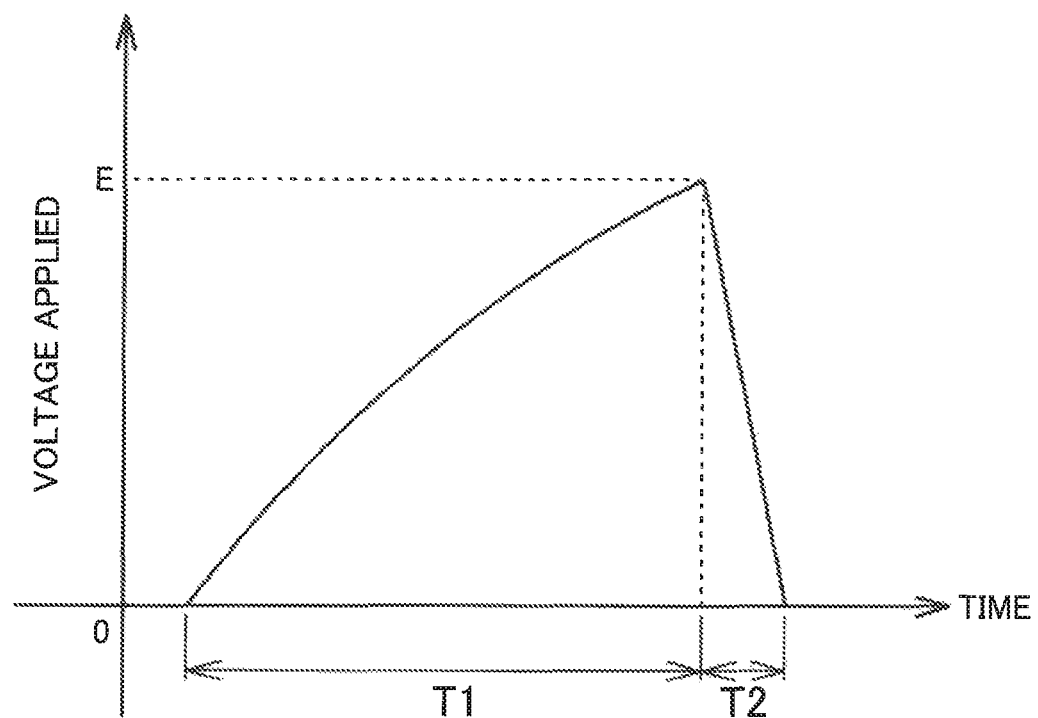
FIG. 6 is a graph schematically illustrating exemplary time-varying changes in the voltage applied to a piezoelectric body included in the pump.

FIG. 6 is a graph schematically illustrating exemplary time-varying changes in the voltage applied to the piezoelectric body 65. The vertical axis in FIG. 6 represents the voltage applied to the piezoelectric body 65, and the horizontal axis in FIG. 6 represents time. Referring to FIG. 6, the driver 70 sequentially applies voltages to the piezoelectric body 65 such that the total voltage applied to the piezoelectric body 65 gradually increases during a time T1, and then the total voltage applied to the piezoelectric body 65 gradually decreases during a time T2.

The controller 80 exercises control for the replenishing process during the preset time T1. Specifically, the controller 80 causes the driver 70 to sequentially apply positive voltages (i.e., the second voltages) to the piezoelectric body 65 such that the total voltage applied to the piezoelectric body 65 gradually increases. During the time T1, the controller 80 turns on (or drives) the first circuits Tr1 of the driving circuits 71 of the driver 70, and turns off (or does not drive) the second circuits Tr2 of the driving circuits 71 of the driver 70. This results in deformation of the piezoelectric body 65 in the direction opposite to the direction of the arrow in FIG. 3 (i.e., the second driving), causing the diaphragm 64 to curve upward. This curved deformation allows the reservoir 63 to be replenished with lubricating oil flowing through the opening 63a.

The controller 80 exercises control for the discharging process during the preset time T2 subsequent to the time T1. Specifically, the controller 80 causes the driver 70 to sequentially apply negative voltages (i.e., the first voltages) to the piezoelectric body 65 such that the total voltage applied to the piezoelectric body 65 gradually decreases. During the time T2, the controller 80 turns on the second circuits Tr2 of the driving circuits 71 of the driver 70, and turns off the first circuits Tr1 of the driving circuits 71 of the driver 70. This results in deformation of the piezoelectric body 65 in the direction of the arrow in FIG. 3 (i.e., the first driving), causing the diaphragm 64 to curve downward. This curved deformation allows lubricating oil stored in the reservoir 63 to be discharged to the annular space 28 through the opening 63b.

The driving circuits 71 used (or turned on) by the controller 80 during the replenishing process (i.e., the time T1) or during the discharging process (i.e., the time T2) are smaller in number than the N driving circuits 71 included in the driver 70. This means that the number of driving circuits 71 included in the driver 70 is larger than the number of driving circuits 71 required for voltage application to the piezoelectric body 65 during the oil feeding operation. The controller 80 selects, from the N driving circuits 71, a predetermined number of the driving circuits 71 to be used. To gradually increase the voltage applied to the piezoelectric body 65, the controller 80 gradually increases the number of driving circuits 71 to be turned on (or the number of driving circuits 71 to apply voltages) until the number of turned-on driving circuits 71 reaches the predetermined number. Alternatively, a discharge duration may be determined on the basis of the capacitor capacitance of the piezoelectric body 65 and the time constant of resistors belonging to the first circuits Tr1 or resistors inside the second circuits Tr2. In such a case, the controller 80 may simultaneously turn on the first circuits Tr1 or the second circuits Tr2 of the predetermined number of driving circuits 71.

As described above, the driving circuits 71 each including the associated first and second circuits Tr1 and Tr2 are connected in parallel to the piezoelectric body 65. This enables voltage application to the piezoelectric body 65 and reduction in the voltage applied to the piezoelectric body 65 by turning on/off the first and second circuits Tr1 and Tr2 of the driving circuits 71 to be used. In other words, this embodiment controls voltage application to the piezoelectric body 65 and reduction in the voltage applied to the piezoelectric body 65 more easily than when dedicated circuit(s) is/are used and/or software control is carried out.

For example, suppose that the first circuits Tr1 of L driving circuits 71 are used for the replenishing process, where L is smaller than N. In this case, the controller 80 increases the number of first circuits Tr1 of the driving circuits 71 to apply voltages to the piezoelectric body 65 in sequence during the time T1 until the number of driving circuits 71 that apply voltages to the piezoelectric body 65 reaches L. Alternatively, the controller 80 may simultaneously turn on the first circuits Tr1 of the L driving circuits 71 as previously mentioned. Thus, the driver 70 sequentially applies voltages to the piezoelectric body 65 during the replenishing process (i.e., the time T) such that the total voltage applied to the piezoelectric body 65 gradually increases until the total voltage applied to the piezoelectric body 65 reaches a voltage E.

The above-described configuration enables the bearing device 100 according to this embodiment to control voltage application to the piezoelectric body 65 during the oil feeding operation (or in particular the replenishing process) in accordance with the number of driving circuits 71 to be used. In other words, the above-described configuration enables the bearing device 100 to control, in accordance with the number of driving circuits 71 to be used, the voltage E applied to the piezoelectric body 65 and the rate of increase in the voltage to be applied. Thus, voltage application to the piezoelectric body 65 in this embodiment is controlled more easily than when voltage application to the piezoelectric body 65 is electrically controlled by software, for example. The driving circuit(s) 71 included in the driver 70 but not required for voltage application to the piezoelectric body 65 may serve as backup (or emergency) driving circuit(s). This would enable the use of the backup driving circuit(s) if the function(s) of one or more of the driving circuit(s) 71 necessary for voltage application to the piezoelectric body 65 degrade(s). Consequently, the oil feeding unit 40 feeds lubricating oil stably.

When the voltage E to be applied to the piezoelectric body 65 during the replenishing process is stored in advance in the controller 80, the controller 80 preferably uses (or turns on) the L driving circuits 71 on the basis of the voltage E, where L is smaller than N. In one example, a voltage e to be applied from each driving circuit 71 is stored in advance in the controller 80, so that the controller 80 uses (or turns on) the L driving circuits 71 necessary for application of the voltage E to the piezoelectric body 65 during the replenishing process (where L=E/e). The controller 80 may preliminary store the association between the voltage E and the number of driving circuits 71 (i.e., the L driving circuits 71) to be used for voltage application to the piezoelectric body 65. The controller 80 may determine the number of driving circuits 71 (i.e., the L driving circuits 71) to be used for voltage application to the piezoelectric body 65 by substituting the voltage E into an arithmetic expression stored in advance. The control exercised in this configuration is more facilitated than when driving circuit(s) capable of changing voltage(s) to be applied to the piezoelectric body 65 is/are used and electrically controlled by, for example, software so as to control the voltage to be applied to the piezoelectric body 65.

The controller 80 more preferably preliminary stores the rate of increase in the voltage to be applied to the piezoelectric body 65 (i.e., the rate of increase per unit time) and increases the number of turned-on driving circuits 71 with the timing based on the rate of increase (i.e., at a rate of increase in the number of turned-on driving circuits 71) during the time T1 until the number of turned-on driving circuits 71 reaches L. The controller 80 may preliminary store the association between the rate of increase in the voltage to be applied and the rate of increase in the number of turned-on driving circuits 71. The controller 80 may determine the rate of increase in the number of turned-on driving circuits 71 by substituting the rate of increase in the voltage to be applied into an arithmetic expression stored in advance. Alternatively, the controller 80 may simultaneously turn on the L driving circuits 71 as previously mentioned. The control exercised in this configuration is more facilitated than when driving circuit(s) capable of changing voltage(s) to be applied to the piezoelectric body 65 is/are used and electrically controlled by, for example, software so as to control the voltage to be applied to the piezoelectric body 65.

The above-described configuration enables the bearing device 100 according to this embodiment to control voltage application to the piezoelectric body 65 during the oil feeding operation (or in particular the replenishing process) in accordance with the number of driving circuits 71. When the first circuits Tr1 of the L driving circuits 71 (where L is smaller than N) are to be used for the replenishing process, the controller 80 sequentially turns on the first circuits Tr1 during the time T1 until the number of turned-on first circuits Tr1 reaches L. Thus, the driver 70 sequentially applies voltages to the piezoelectric body 65 during the replenishing process (i.e., the time T1) such that the total voltage applied to the piezoelectric body 65 gradually increases until the total voltage reaches the voltage E. The controller 80 may simultaneously turn on the first circuits Tr1 of the L driving circuits 71 as previously mentioned.

The controller 80 may control the discharging process of the oil feeding operation in a manner similar to that described above. For example, suppose that the second circuits Tr2 of M driving circuits 71 are used for the discharging operation (where M is smaller than N). In this case, the controller 80 sequentially turns on the second circuits Tr2 during the time T2 until the number of turned-on second circuits Tr2 reaches M. Thus, the total voltage applied to the piezoelectric body 65 gradually decreases during the discharging process (i.e., the time T2). The controller 80 may simultaneously turn on the second circuits Tr2 of the M driving circuits 71 as previously mentioned.

This configuration enables the bearing device 100 according to this embodiment to control voltage application to the piezoelectric body 65 in accordance with the number of driving circuits 71 also during the discharging process of the oil feeding operation. The controller 80 may preliminary store the association between negative voltages to be applied to the piezoelectric body 65 and the number of driving circuits 71 (i.e., the M driving circuits 71) to be used for voltage application to the piezoelectric body 65. The controller 80 may determine the number of driving circuits 71 (i.e., the M driving circuits 71) to be used for voltage application to the piezoelectric body 65 by substituting the voltage E into an arithmetic expression stored in advance.

The controller 80 preferably communicates with each of the N driving circuits 71 included in the driver 70 so as to determine occurrence of a failure in each of the N driving circuits 71. In one example, the controller 80 outputs a control signal to each driving circuit 71 so as to turn on each driving circuit 71. In this case, each driving circuit 71 outputs a signal indicative of a response to the control signal to the controller 80, and the controller 80 determines occurrence of a failure in each driving circuit 71 on the basis of the signal indicative of the response. Such a configuration enables determination of faulty one(s) of the N driving circuits. This results in early detection of a failure in the driver 70 to drive the oil feeding unit 40 and avoidance of suspension of oil feeding. Consequently, this configuration makes it possible to prevent a failure, such as seizure of the bearing body 20.

The controller 80 more preferably preliminary stores the rate of decrease in the voltage to be applied to the piezoelectric body 65 and increases the number of turned-on driving circuits 71 with the timing based on the rate of decrease (i.e., at a rate of increase in the number of turned-on driving circuits 71) during the time T2 until the number of turned-on driving circuits 71 reaches M. The controller 80 may preliminary store the association between the rate of decrease in the voltage to be applied and the rate of increase in the number of turned-on driving circuits 71. The controller 80 may determine the rate of increase in the number of turned-on driving circuits 71 by substituting the rate of decrease in the voltage to be applied into an arithmetic expression stored in advance. The controller 80 may simultaneously turn on the M driving circuits 71 as previously mentioned.

The controller 80 more preferably uses a predetermined number of the driving circuits 71 selected from normally operating ones of the N driving circuits 71 on the basis of the voltage E to be applied to the piezoelectric body 65 (where the predetermined number is smaller than N). If a failure occurs in one or more of the N driving circuits 71 included in the driver 70, this configuration would enable the oil feeding operation as long as the number of normally operating ones of the driving circuits 71 is equal to or greater than the number of driving circuits 71 necessary for voltage application to the piezoelectric body 65. Consequently, this configuration enables stable oil feeding.

When the number of faulty ones of the driving circuits 71 is equal to or greater than a threshold value stored in advance, the controller 80 may preferably cause information indicating an error to appear, for example, on a display (not illustrated), thus providing notification of the error. In one example, the threshold value is smaller than the number of driving circuits 71 necessary for voltage application to the piezoelectric body 65. The controller 80 more preferably determines occurrence of failure(s) in the driving circuits 71 at a time when no oil feeding operation is being performed. Such a configuration enables early detection of a failure in the driver 70 to drive the oil feeding unit 40 and avoidance of suspension of oil feeding. This makes it possible to prevent a failure, such as seizure of the bearing body 20.

Figure 7:
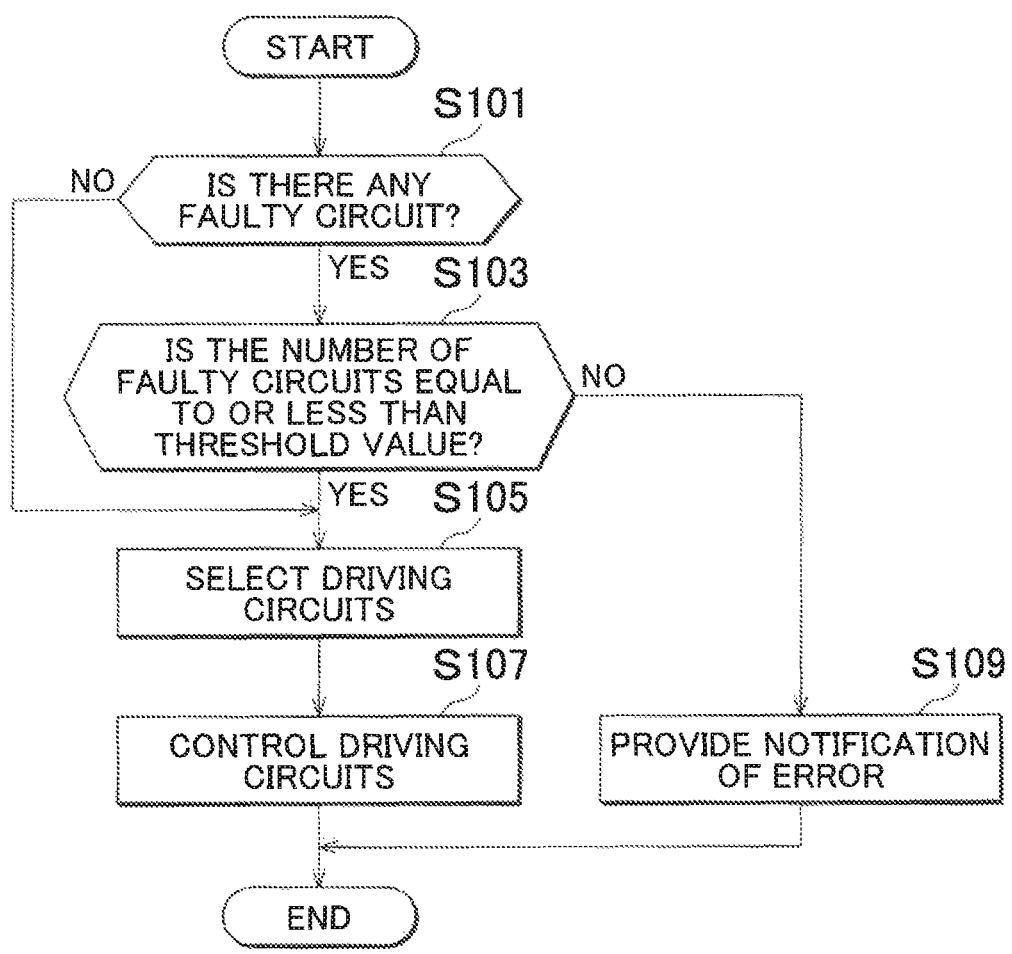
FIG. 7 is a flow chart illustrating the procedure of a first control method to be performed by the controller when the bearing device according to this embodiment carries out an oil feeding operation.

FIG. 7 is a flow chart of a first control method for the oil feeding unit 40 of the bearing device 100 according to this embodiment. In other words, FIG. 7 is a flow chart illustrating the procedure of the first control method to be performed by the controller 80 when the bearing device 100 according to this embodiment carries out the oil feeding operation. The CPU 10 of the controller 80 reads the program stored in the ROM 11 into the RAM 12 and executes the program, thus performing the operation described in the flow chart of FIG. 7. Upon detecting a predetermined oil feeding operation start timing or a timing preceding the oil feeding operation start timing by a predetermined period of time, the CPU 10 of the controller 80 starts the operation described in the flow chart of FIG. 7. In one example, the oil feeding operation start timing is a timing at which a predetermined period of time has elapsed from the immediately preceding oil feeding operation. The oil feeding operation includes both of the replenishing process and the discharging process as already mentioned above.

Referring to FIG. 7, at the oil feeding operation start timing or the timing preceding the oil feeding operation start timing by a predetermined period of time, the CPU 10 determines if there is occurrence of failure(s) on the basis of signals from the N driving circuits 71 included in the driver 70. Specifically, at a replenishing process start timing or a timing preceding the replenishing process start timing by a predetermined period of time, the CPU 10 if there is determines occurrence of a failure in each driving circuit 71. At a discharging process start timing or a timing preceding the discharging process start timing by a predetermined period of time, the CPU 10 determines if there is occurrence of a failure in each driving circuit 71. A method for making determinations is not limited to any particular method. When one or more of the driving circuits 71 is/are faulty (i.e., when the answer is YES in step S101), the CPU 10 determines whether the number of faulty ones of the driving circuits 71 is greater than a threshold value (i.e., a predetermined number) stored in advance.

When all the driving circuits 71 included in the driver 70 are operating normally (i.e., when the answer is NO in step S101) or when the number of faulty ones of the driving circuits 71 is not greater than the threshold value (i.e., when the answer is YES in step S103), the CPU 10 selects, in step S105, the driving circuits 71 to be used for voltage application to the piezoelectric body 65. Specifically, when all the driving circuits 71 included in the driver 70 are operating normally (i.e., when the answer is NO in step S101), the CPU 10 selects, in step S105, a predetermined number of the driving circuits 71 to be used for voltage application to the piezoelectric body 65 from the N driving circuits 71 included in the driver 70 (where the predetermined number is smaller than N). When the number of faulty ones of the driving circuits 71 is not greater than the threshold value (i.e., when the answer is YES in step S103), the CPU 10 selects, in step S105, a predetermined number of the driving circuits 71 to be used for voltage application to the piezoelectric body 65 from normally operating ones of the N driving circuits 71 included in the driver 70 (where the predetermined number is smaller than N).

In performing the replenishing process, the CPU 10 selects, in step S105, the L driving circuits 71 necessary for application of the voltage E to the piezoelectric body 65. In performing the discharging process, the CPU 10 selects, in step S105, the M driving circuits 71 required to reduce the voltage E applied to the piezoelectric body 65 (i.e., the M driving circuits 71 necessary for application of the negative voltage E).

In step S107, the CPU 10 controls the selected driving circuits 71 so as to cause the selected driving circuits 71 to apply voltages to the piezoelectric body 65. Specifically, in performing the replenishing process, the CPU 10 sequentially turns on, in step S107, the first circuits Tr1 of the selected driving circuits 71 during the time T1 until the number of turned-on first circuits Tr1 reaches L. Alternatively, the CPU 10 may simultaneously turn on the first circuits Tr1 of the L driving circuits 71. In performing the discharging process, the CPU 10 sequentially turns on, in step S107, the second circuits Tr2 of the selected driving circuits 71 during the time T2 until the number of turned-on second circuits Tr2 reaches M. Alternatively, the CPU 10 may simultaneously turn on the second circuits Tr2 of the M driving circuits 71.

When the number of faulty ones of the driving circuits 71 is greater than the threshold value (i.e., when the answer is NO in step S103), the CPU 10 may provide, in step S109, notification of an error, for example, on a display (not illustrated).

The driver 70 and the controller 80 that function as the control apparatus to control the fluid feeder (e.g., the oil feeding unit 40) are configured to perform the above-described steps. Thus, if some of the driving circuits 71 included in the driver 70 are faulty, the oil feeding operation would still be performed. Consequently, the driver 70 and the controller 80 enable stable oil feeding.

The voltage to be applied to the piezoelectric body 65 and the rate of change (e.g., the rate of increase and the rate of decrease) in the voltage to be applied are controllable in accordance with the number of driving circuits 71 to be turned on. Accordingly, the control performed in this embodiment is more facilitated than when the driving circuits 71 are electrically controlled by software, for example.

The controller 80 may decide the voltage E to be applied to the piezoelectric body 65 and the rate of change, such as the rate of increase and the rate of decrease, in the voltage to be applied (i.e., the times T1 and T2 during which voltage application is to be performed) in accordance with the index value of viscosity of lubricating oil indicated by a detection signal from the sensor 60. This is because the amount and rate of discharge of lubricating oil is influenced by the viscosity of lubricating oil. Specifically, supposing that the viscosity index value is the temperature of lubricating oil, the lower the temperature of lubricating oil, the higher the viscosity of lubricating oil, resulting in increases in resistance during suction of lubricating oil into the reservoir 63 and resistance during discharge of lubricating oil from the reservoir 63. Thus, assuming that lubricating oil has a temperature lower than a preset temperature specified in a design stage, the amount of lubricating oil sucked into the reservoir 63 in this case might be smaller than when lubricating oil having the preset temperature is sucked into the reservoir 63, and the amount of lubricating oil discharged from the reservoir 63 in this case might be smaller than when lubricating oil having the preset temperature is discharged from the reservoir 63. In other words, lubricating oil having a temperature lower than the preset temperature might not be fed stably.

To solve the above problems, the controller 80 of the bearing device 100 according to this embodiment performs a second control method involving: obtaining the temperature of lubricating oil serving as an example of the index value of lubricating oil; and controlling the oil feeding operation in accordance with the temperature obtained. Specifically, in performing the replenishing process and the discharging process, the controller 80 controls the voltage to be applied to the piezoelectric body 65 such that the amount of change in the capacity of the reservoir 63 per unit time is responsive to the temperature of lubricating oil. In other words, supposing that the voltage E to be applied to the piezoelectric body 65 is kept constant, the controller 80 exercises control such that the amount of change in the voltage to be applied to the piezoelectric body 65 per unit time (i.e., the duration of application of the voltage E) is responsive to the temperature of lubricating oil. The temperature of lubricating oil is obtained on the basis of a detection signal from the sensor 60.

Figure 8:
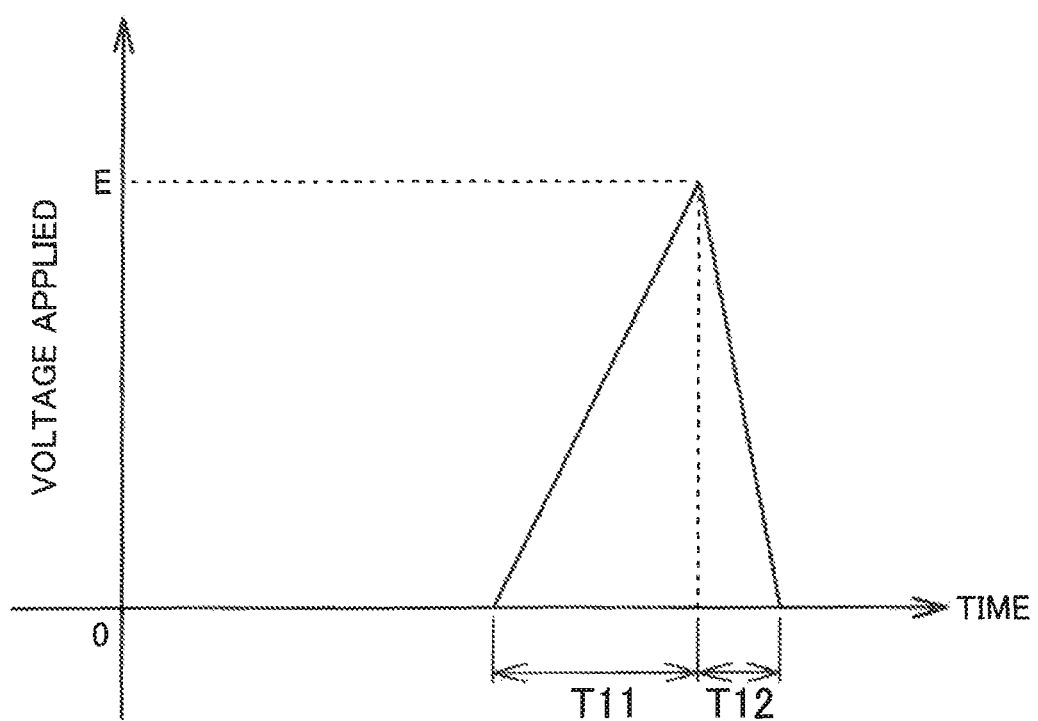
FIG. 8 is a graph schematically illustrating time-varying changes in the voltage applied to the piezoelectric body when a second control method is performed by the controller of the bearing device according to this embodiment, with the temperature of lubricating oil kept at a preset temperature.
Figure 9:
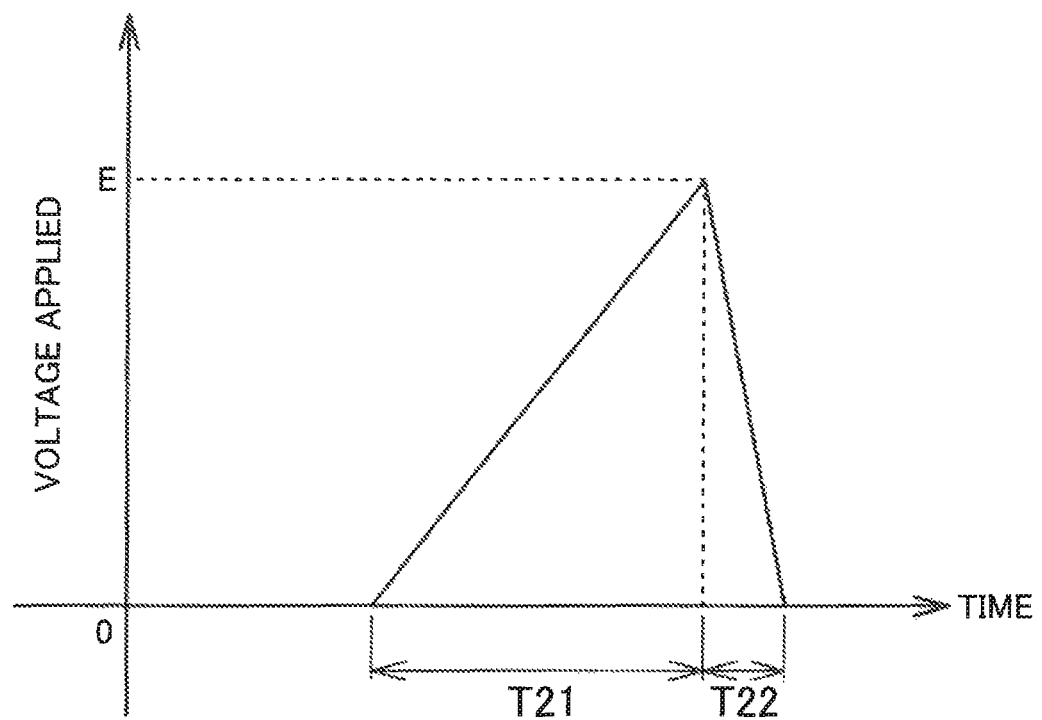
FIG. 9 is a graph schematically illustrating time-varying changes in the voltage applied to the piezoelectric body when the second control method is performed by the controller of the bearing device according to this embodiment, with the temperature of lubricating oil kept below the preset temperature.

FIGS. 8 and 9 are graphs each schematically illustrating time-varying changes in the voltage applied to the piezoelectric body 65 when the second control method is performed by the controller 80 of the bearing device 100 according to this embodiment. The temperature of lubricating oil in FIG. 8 differs from the temperature of lubricating oil in FIG. 9. FIG. 8 illustrates time-varying changes in the voltage applied to the piezoelectric body 65 when lubricating oil has a preset temperature (e.g., a temperature higher than a predetermined low temperature). FIG. 9 illustrates time-varying changes in the voltage applied to the piezoelectric body 65 when lubricating oil has a temperature lower than the preset temperature.

Specifically, a comparison between FIGS. 8 and 9 reveals that the controller 80 of the bearing device 100 according to this embodiment performs the second control method during the replenishing process so as to ensure that the rate of voltage increase for application of the predetermined voltage E to the piezoelectric body 65 when lubricating oil has a temperature below the preset temperature (FIG. 9) is lower than the rate of voltage increase for application of the predetermined voltage E to the piezoelectric body 65 when lubricating oil has the preset temperature (FIG. 8). In other words, the controller 80 exercises control such that the duration of voltage application to the piezoelectric body 65 when lubricating oil has a temperature below the preset temperature (i.e., a time T21) is longer than the duration of voltage application to the piezoelectric body 65 when lubricating oil has the preset temperature (i.e., a time T11). This means that T21>T11.

The controller 80 selects the L driving circuits 71 in performing the replenishing process (where L is smaller than N). To cause the rate of increase in the voltage application to the piezoelectric body 65 to be responsive to the temperature of lubricating oil, the second control method performed by the controller 80 according to this embodiment involves: obtaining the temperature of lubricating oil on the basis of a sensor signal from the sensor 60; and deciding, on the basis of the temperature of lubricating oil, a timing at which each of the L driving circuits 71 is to be turned on. For example, suppose that the voltage to be applied to the piezoelectric body 65 is changed linearly. In this case, the controller 80 decides, on the basis of the temperature of lubricating oil, a rate at which the L driving circuits 71 are to be turned on (i.e., the rate of increase in the number of driving circuits 71 to be turned on until the number of turned-on driving circuits 71 reaches L). In performing the replenishing process, the controller 80 sequentially turns on the first circuits Tr1 of the driving circuits 71 at the decided increase rate until the number of turned-on first circuits Tr1 reaches L. The controller 80 may preliminary store the association between the temperature of lubricating oil and the rate of increase in the number of driving circuits 71 to be turned on. The controller 80 may determine the rate of increase in the number of driving circuits 71 to be turned on by substituting the temperature of lubricating oil into an arithmetic expression stored in advance. The controller 80 may simultaneously turn on the first circuits Tr1 of the L driving circuits 71 as previously mentioned.

Controlling the replenishing process as described above ensures that the rate of increase in the capacity of the reservoir 63 when lubricating oil has a temperature below the preset temperature is lower than the rate of increase in the capacity of the reservoir 63 when lubricating oil has the preset temperature, and the duration (or rate) of suction of lubricating oil into the reservoir 63 when lubricating oil has a temperature below the preset temperature is longer (or lower) than the duration (or rate) of suction of lubricating oil into the reservoir 63 when lubricating oil has the preset temperature. Thus, if the viscosity of lubricating oil is higher than when lubricating oil has the preset temperature, so that resistance during suction of lubricating oil into the reservoir 63 increases, the reservoir 63 would be replenished with a required amount of lubricating oil. Consequently, a desired amount of lubricating oil will be stably discharged from the reservoir 63.

The controller 80 of the bearing device 100 according to this embodiment preferably carries out the second control method involving exercising control in accordance with the temperature of lubricating oil also in performing the discharging process. Specifically, the controller 80 according to this embodiment performs the second control method during the discharging process so as to ensure that the rate of decrease in the voltage applied to the piezoelectric body 65 when lubricating oil has a temperature below the preset temperature is higher than the rate of decrease in the voltage applied to the piezoelectric body 65 when the lubricating oil has the preset temperature. In other words, the controller 80 exercises control such that the time required for the voltage applied to the piezoelectric body 65 to decrease to a predetermined level when lubricating oil has a temperature below the preset temperature (i.e., a time T22) is shorter than the time required for the voltage applied to the piezoelectric body 65 to decrease to the predetermined level when lubricating oil has the preset temperature (i.e., a time T12). This means that T22<T12.

The controller 80 selects the M driving circuits 71 in performing the discharging process (where M is smaller than N). To cause the rate of decrease in the voltage application to the piezoelectric body 65 to be responsive to the temperature of lubricating oil, the second control method performed by the controller 80 according to this embodiment involves: obtaining the temperature of lubricating oil on the basis of a detection signal from the sensor 60; and deciding, on the basis of the temperature of lubricating oil, a rate at which the M driving circuits 71 are to be turned on (i.e., the rate of increase in the number of driving circuits 71 to be turned on until the number of turned-on driving circuits 71 reaches M). In performing the discharging process, the controller 80 sequentially turns on the second circuits Tr2 of the driving circuits 71 at the decided increase rate until the number of turned-on second circuits Tr2 reaches M. Alternatively, the controller 80 may simultaneously turn on the second circuits Tr2 of the M driving circuits 71 as previously mentioned.

Controlling the discharging process as described above ensures that the rate of decrease in the capacity of the reservoir 63 when lubricating oil has a temperature below the preset temperature is higher than the rate of decrease in the capacity of the reservoir 63 when lubricating oil has the preset temperature, and the duration (or rate) of discharge of lubricating oil from the reservoir 63 when lubricating oil has a temperature below the preset temperature is shorter (or higher) than the duration (or rate) of discharge of lubricating oil from the reservoir 63 when lubricating oil has the preset temperature. Thus, if the viscosity of lubricating oil is higher than when lubricating oil has the preset temperature, so that resistance during discharge of lubricating oil from the reservoir 63 increases, a desired amount of lubricating oil would be stably discharged from the reservoir 63.

Figure 10:
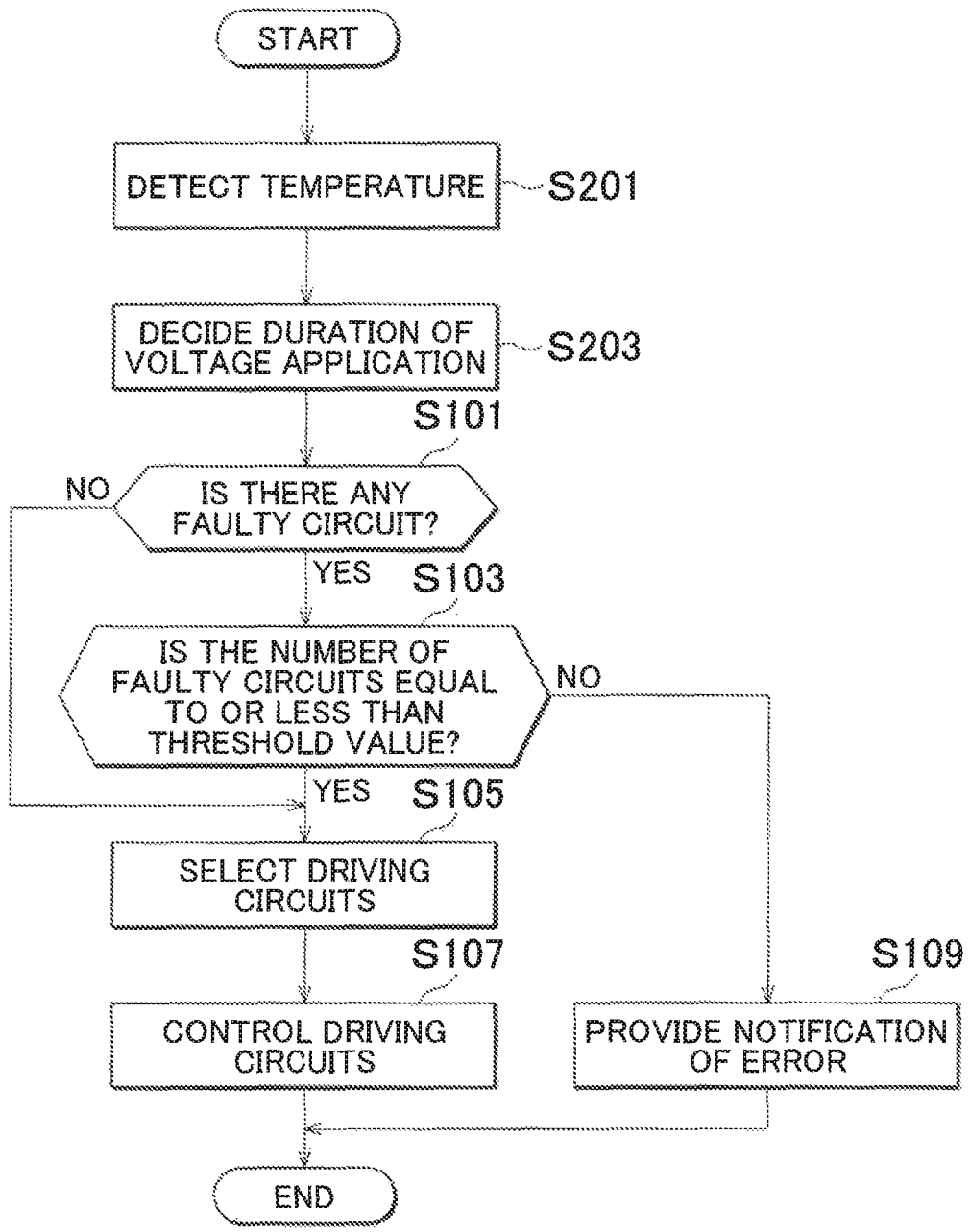
FIG. 10 is a flow chart illustrating the procedure of the second control method to be performed by the controller when the bearing device according to this embodiment carries out an oil feeding operation.

FIG. 10 is a flow chart of the second control method for the oil feeding unit 40 of the bearing device 100 according to this embodiment. Specifically, FIG. 10 is a flow chart illustrating the procedure of the second control method to be performed by the controller 80 when the bearing device 100 according to this embodiment carries out the oil feeding operation. Similarly to the procedure illustrated in FIG. 7, the CPU 10 of the controller 80 reads the program stored in the ROM 11 into the RAM 12 and executes the program, thus performing the operation described in the flow chart of FIG. 10. The steps in the flow chart of FIG. 10 corresponding to those in the flow chart of FIG. 7 are identified by the same step numbers.

Referring to FIG. 10, a first example of the second control method will be described. At an oil feeding operation start timing or a timing preceding the oil feeding operation start timing by a predetermined period of time, the CPU 10 detects, in step S201, the temperature of lubricating oil on the basis of a detection signal from the sensor 60. Following the detection of the temperature of lubricating oil in step S201, the CPU 10 decides, in step S203, the duration of voltage application to the piezoelectric body 65 on the basis of the temperature detected in step S201. Specifically, in performing the replenishing process, the CPU 10 decides, in step S203, a time during which the voltage applied to the piezoelectric body 65 increases to the predetermined voltage E (i.e., the rate of increase in the number of driving circuits 71 to be turned on until the number of turned-on driving circuits 71 reaches a predetermined number required for application of the voltage E) such that the rate of increase in the capacity of the reservoir 63 is responsive to the temperature of lubricating oil. Suppose that control to be performed during the discharging process is similar to that performed during the replenishing process. In this case, the CPU 10 decides, in step S203, a time during which the voltage applied to the piezoelectric body 65 decreases (i.e., the rate of increase in the number of driving circuits 71 to be turned on until the number of turned-on driving circuits 71 reaches a predetermined number required for application of a predetermined negative voltage) such that the rate of decrease in the capacity of the reservoir 63 is responsive to the temperature of lubricating oil.

Upon deciding the duration of voltage application (i.e. the rate of increase in the number of driving circuits 71 to be turned on) in step S203, the CPU 10 carries out step S101 and subsequent steps illustrated in FIG. 10. Specifically, when determination of occurrence of a failure in each driving circuit 71 indicates that the number of faulty ones of the driving circuits 71 is not greater than the threshold value, the CPU 10 selects a predetermined number of the driving circuits 71 to be used for voltage application to the piezoelectric body 65 from normally operating ones of the driving circuits 71 (where the predetermined number is smaller than N). The CPU 10 exercises control so as to cause the selected driving circuits 71 to apply voltages to the piezoelectric body 65. The CPU 10 may simultaneously turn on the selected driving circuits 71 as previously mentioned. In such a case, the CPU 10 skips step S203 (i.e., the process of deciding the rate of increase in the number of driving circuits 71 to be turned on).

A second example of the second control method performed by the controller 80 may involve deciding the voltage E to be applied to the piezoelectric body 65 in accordance with environmental information, such as the temperature of lubricating oil, supposing that the amount of change in the voltage to be applied to the piezoelectric body 65 per unit time (i.e., the duration of voltage application) is constant. Specifically, in performing the replenishing process, the second example of the second control method performed by the controller 80 of the bearing device 100 according to this embodiment involves exercising control such that the voltage E to be applied to the piezoelectric body 65 when lubricating oil has a temperature below the preset temperature is higher than the voltage E to be applied to the piezoelectric body 65 when lubricating oil has the preset temperature. Thus, in performing the replenishing process, the controller 80 selects a predetermined number of the driving circuits 71 to be used for voltage application to the piezoelectric body 65 such that the predetermined number is smaller than N and responsive to the temperature of lubricating oil. The controller 80 may preliminary store the association between the temperature of lubricating oil and the number of driving circuits 71 to be used. The controller 80 may determine the number of driving circuits 71 to be used by substituting the temperature of lubricating oil into an arithmetic expression stored in advance.

Controlling the replenishing process as described above ensures that the rate of increase in the capacity of the reservoir 63 when lubricating oil has a temperature below the preset temperature is higher than the rate of increase in the capacity of the reservoir 63 when lubricating oil has the preset temperature, and the force of suction of lubricating oil into the reservoir 63 when lubricating oil has a temperature below the preset temperature is greater than the force of suction of lubricating oil into the reservoir 63 when lubricating oil has the preset temperature. Thus, even if the viscosity of lubricating oil is higher than when lubricating oil has the preset temperature, so that resistance during suction of lubricating oil into the reservoir 63 increases, the reservoir 63 would be replenished with a required amount of lubricating oil. Consequently, a desired amount of lubricating oil will be stably discharged from the reservoir 63.

Also in the second example, the CPU 10 of the controller 80 performs processes substantially similar to those illustrated in the flow chart of FIG. 10. Specifically, step S203 performed by the CPU 10 in the second example involves deciding a voltage to be applied on the basis of the temperature of lubricating oil detected, instead of deciding the duration of voltage application.

A third example of the second control method is a combination of the first and second examples described above. The third example of the second control method performed by the controller 80 may involve deciding, in accordance with environmental information (such as the temperature of lubricating oil), both of the amount of change in the voltage to be applied to the piezoelectric body 65 per unit time (i.e., the duration of voltage application to the piezoelectric body 65) and the voltage E to be applied to the piezoelectric body 65.

The driver 70 and the controller 80 that function as the control apparatus to control the fluid feeder (e.g., the oil feeding unit 40) are configured to perform the above-described steps. Thus, if the amount of lubricating oil fed to the bearing body 20 from the oil feeding unit 40 varies in accordance with a change in the viscosity of lubricating oil, this variation would be reduced. This results in stable oil feeding.

Although the above description has been based on the assumption that the capacity of the reservoir 63 increases as the voltage applied to the piezoelectric body 65 increases, and the capacity of the reservoir 63 decreases as the voltage applied to the piezoelectric body 65 decreases, this relationship is provided by way of example only. Alternatively, the capacity of the reservoir 63 may decrease as the voltage applied to the piezoelectric body 65 increases, and the capacity of the reservoir 63 may increase as the voltage applied to the piezoelectric body 65 decreases. In such a case, the controller 80 exercises control such that the processes of increasing and reducing the voltage applied to the piezoelectric body 65 in the above-described examples are performed in reverse.

The embodiment disclosed herein is to be considered in all respects as illustrative and not as restrictive. The scope of the invention is defined not by the foregoing description but by the following claims. The scope of the invention is intended to encompass all modifications and changes falling within the scope of the claims and their equivalents.

The invention enables a fluid feeder including a piezoelectric element to feed fluid stably.

What is claimed is:

1. An apparatus for controlling driving of a fluid feeder, the fluid feeder including a piezoelectric element that deforms in response to voltage application and a reservoir to store fluid to be fed, the fluid feeder being configured to cause (i) a change in capacity of the reservoir in accordance with first deformation of the piezoelectric element so as to discharge the fluid from the reservoir and (ii) a change in capacity of the reservoir in accordance with second deformation of the piezoelectric element so as to suck the fluid into the reservoir, the apparatus comprising:
 a rolling bearing with an oil feeding unit, the oil feeding unit including driving circuits to apply voltages to the piezoelectric element; and
 a controller configured to control the application of voltages to the piezoelectric element from the driving circuits, the controller being further configured to:
  (i) obtain an index value of viscosity of the fluid to be fed,
  (ii) decide, in accordance with the index value, an amount of change in voltage to be applied to the piezoelectric element per unit time, and
  (iii) decide, in accordance with the amount of change in voltage to be applied to the piezoelectric element per unit time, a timing of voltage application to the piezoelectric element from each of the driving circuits to be used, wherein:
 during the second deformation, the controller is configured to control the driving circuits such that the amount of change in voltage to be applied to the piezoelectric element per unit time is lower when a temperature of the fluid is below a preset temperature than when the temperature of the fluid is not below the preset temperature,
 the number of driving circuits is N, where N is an integer equal to or greater than two,
 the N driving circuits are connected in parallel to the piezoelectric element, and
 when the fluid feeder feeds the fluid, the controller causes a predetermined number of the driving circuits selected from the N driving circuits to be used, the predetermined number being smaller than N.

2. The apparatus according to claim 1, wherein:
each of the driving circuits includes:
 a first circuit to apply a voltage to the piezoelectric element so as to cause the piezoelectric element to develop the second deformation, and
 a second circuit to apply a voltage to the piezoelectric element so as to cause the piezoelectric element to develop the first deformation,
when the fluid feeder feeds the fluid, the controller causes the second circuits of M driving circuits selected from the N driving circuits to be used, and
when the fluid is sucked into the reservoir, the controller causes the first circuits of L driving circuits selected from the N driving to be used.

3. The apparatus according to claim 2, wherein the controller selects the driving circuits to be used from the N driving circuits in accordance with a voltage to be applied to the piezoelectric element.

4. The apparatus according to claim 3, wherein the controller decides, in accordance with the index value, the voltage to be applied to the piezoelectric element.

5. The apparatus according to claim 2, wherein the controller determines a faulty one or faulty ones of the driving circuits in accordance with signals from the driving circuits, and selects the driving circuits to be used from normally operating ones of the N driving circuits.

6. The apparatus according to claim 5, wherein when the number of faulty ones of the N driving circuits has reached a threshold value stored in advance, the controller provides notification of this condition.

7. The apparatus according to claim 1, wherein the controller selects the driving circuits to be used from the N driving circuits in accordance with a voltage to be applied to the piezoelectric element.

8. The apparatus according to claim 7, wherein the controller decides, in accordance with the index value, the voltage to be applied to the piezoelectric element.

9. The apparatus according to claim 8, wherein the index value of viscosity of the fluid includes the temperature of the fluid.

10. The apparatus according to claim 1, wherein the index value of viscosity of the fluid includes the temperature of the fluid.

11. The apparatus according to claim 1, wherein the controller determines a faulty one or faulty ones of the driving circuits in accordance with signals from the driving circuits, and selects the driving circuits to be used from normally operating ones of the N driving circuits.

12. The apparatus according to claim 11, wherein when the number of faulty ones of the N driving circuits has reached a threshold value stored in advance, the controller provides notification of this condition.

13. The apparatus according to claim 1, wherein the driving circuits include first circuits and second circuits such that each of the first driving circuits are connected in series with an associated one of the second circuits with a resistor disposed there between, the first circuits applying positive voltages to the piezoelectric element and the second circuits applying negative voltages to the piezoelectric element.

14. The apparatus according to claim 1, wherein the piezoelectric element is the only piezoelectric body for controlling the driving of the fluid feeder, and the driving circuits are connected in parallel to the piezoelectric element.

15. A method for controlling a fluid feeder to feed fluid, the method comprising:
    a) feeding a lubricating liquid to a rolling bearing of a fluid feeder,
        the fluid feeder including a piezoelectric element that deforms in response to voltage application and a reservoir to store the fluid to be fed,
        the fluid feeder being configured to cause (i) a change in capacity of the reservoir in accordance with first deformation of the piezoelectric element so as to discharge the fluid from the reservoir and (ii) a change in capacity of the reservoir in accordance with second deformation of the piezoelectric element so as to suck the fluid into the reservoir, and
        the piezoelectric element being connected in parallel to a plurality of driving circuits configured to apply voltages to the piezoelectric element,
    b) selecting, from the plurality of driving circuits, a predetermined number of the driving circuits to be used for voltage application to the piezoelectric element;
    c) obtaining an index value of viscosity of the fluid to be fed,
    d) deciding, in accordance with the index value, an amount of change in voltage to be applied to the piezoelectric element per unit time,
    e) deciding, in accordance with the amount of change in voltage to be applied to the piezoelectric element per unit time, a timing of voltage application to the piezoelectric element from each of the driving circuits to be used, and
    f) causing the selected driving circuits to apply voltages to the piezoelectric element,
    wherein during the second deformation, the driving circuits are controlled such that the amount of change in voltage per unit time is lower when a temperature of the fluid is below a preset temperature than when the temperature of the fluid is not below the preset temperature, and
    wherein the predetermined number of driving circuits selected in step b) is smaller than a total number of driving circuits connected in parallel to the piezoelectric element.

* * * * *